United States Patent [19]

Motoyoshi

[11] Patent Number: 5,327,002
[45] Date of Patent: Jul. 5, 1994

[54] SRAM WITH GATE OXIDE FILMS OF VARIED THICKNESS

[75] Inventor: Makoto Motoyoshi, Chiba, Japan

[73] Assignee: Kawasaki Steel Corporation, Hyogo, Japan

[21] Appl. No.: 880,700

[22] Filed: May 8, 1992

[30] Foreign Application Priority Data

May 15, 1991 [JP] Japan ................ 3-110285

[51] Int. Cl.$^5$ ........................................... H01L 29/78
[52] U.S. Cl. ................................. 257/380; 257/410
[58] Field of Search ............... 257/380, 393, 903, 904, 257/410, 411; 365/154

[56] References Cited

U.S. PATENT DOCUMENTS

| | | | |
|---|---|---|---|
| 4,627,153 | 12/1986 | Masuoka | 29/571 |
| 4,951,112 | 8/1990 | Choi et al. | 365/154 |
| 5,010,521 | 4/1991 | Matsui | 365/154 |

FOREIGN PATENT DOCUMENTS 60-254653 12/1985 Japan.
62-230058 8/1987 Japan.

*Primary Examiner*—Robert Limenak
*Attorney, Agent, or Firm*—Oliff & Berridge

[57] ABSTRACT

A semiconductor memory device of the SRAM type includes a memory cell including a pair of inverters each having a resistor and a driving transistor connected in series forming a storage node at the junction point thereof. Switching transistors in the memory cell are respectively connected between the storage nodes and bit lines. A film thickness of a gate oxide film of each of the switching transistors (transfer MOS transistors) is larger than a film thickness of a gate oxide film of each of the driving transistors (driver MOS transistors).

7 Claims, 8 Drawing Sheets

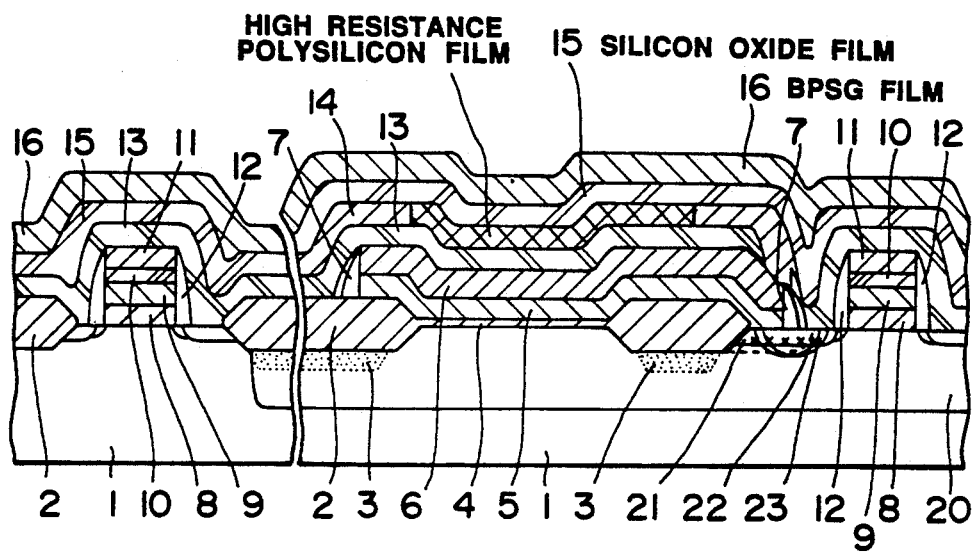
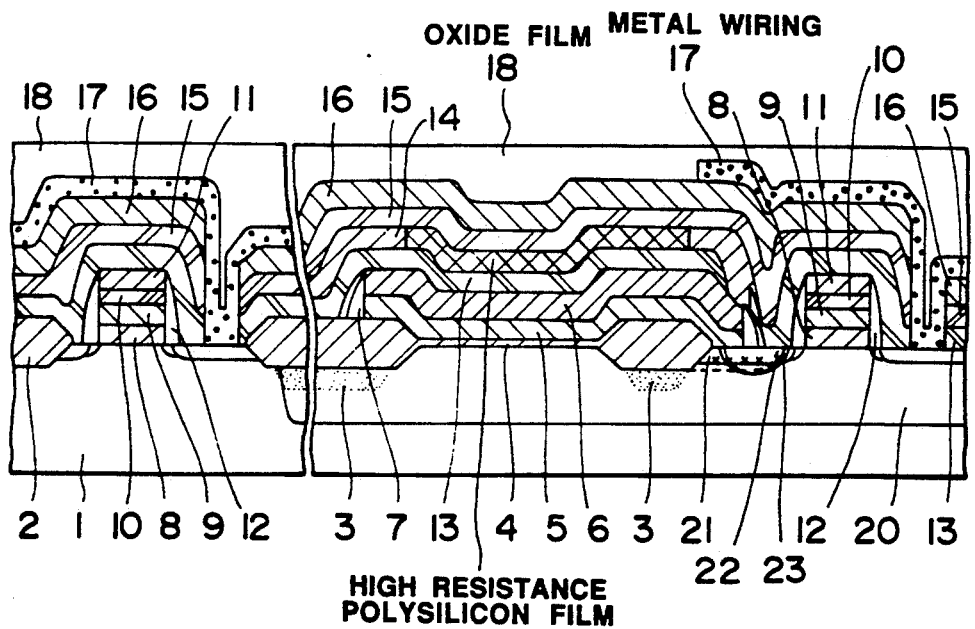

SRAM WITH GATE OXIDE FILMS OF VARIED THICKNESS

BACKGROUND OF THE INVENTION

1. Field on the Invention

The present invention relates to a semiconductor memory device, and in particular, to a semiconductor memory device including a SRAM (static random access memory).

2. Description of the Prior Art

Semiconductor memory devices include volatile memories which can retain information only when power is being turned on, and nonvolatile memories which can retain information even when power is turned off. The volatile memories include a SRAM (static random access memory) and a DRAM (dynamic RAM), and the nonvolatile memories include a mask ROM (mask read only memory), a PROM (programmable ROM), an EPROM (erasable programmable ROM), and an EEPROM (electrically erasable and programmable ROM), and the like.

Among the volatile memories, the SRAM is frequently used in super computers and central portions of many computers, and in office automation equipment, and the like, because the timing of memory operation of the SRAM is easily achieved, no complicated refresh control is required thereby to facilitate the usage, and also the high speed operation is easily attained.

This SRAM has a structure, for example, as shown in FIG. 11, including switching transistors $Q_1$ and $Q_4$, driving transistors $Q_2$ and $Q_3$, and resistors $R_1$ and $R_2$. An inverter is formed by the driving transistor $Q_2$ and the resistor $R_1$, and another inverter is formed by the driving transistor $Q_3$ and the resistor $R_2$, and in these two inverters, the output of one inverter is an input of the other inverter, and vice versa. A storage node $N_1$ at the junction point between the driving transistor $Q_2$ and the resistor $R_1$, and a storage node $N_2$ at the junction point between the driving transistor $Q_3$ and the resistor $R_2$ are respectively connected to bit lines 200 through respective switching transistors $Q_1$ and $Q_4$. The gates of the switching transistors $Q_1$ and $Q_4$ are connected to a word line 100. Furthermore, the switching transistors $Q_1$ and the driving transistor $Q_2$ form another inverter (hereinafter referred to as a $Q_1$-$Q_2$ inverter), and the driving transistor $Q_3$ and the switching transistors $Q_4$ form still another inverter (hereinafter referred to as a $Q_3$-$Q_4$ inverter).

In this SRAM, a high potential of the storage nodes $N_1$ and $N_2$ corresponds to a logic "1", and a low potential of the storage nodes $N_1$ and $N_2$ corresponds to a logic "0". Specifically, when the storage nodes $N_1$ is applied with a high potential, the driving transistor $Q_3$ is turned on to make the storage node $N_2$ to assume a low potential, and the driving transistor $Q_2$ is turned off to hold the storage modes $N_1$ at the high potential. Conversely, when the storage modes $N_1$ is applied with a low potential, the storage node $N_2$ is maintained at a high potential in a similar manner. This state is maintained as far as the power supply voltage is supplied, and as far as the potentials of the storage nodes $N_1$ and $N_2$ are not changed externally.

In the SRAM shown in FIG. 11, supposing that a certain memory cell (i-th row and j-th column) is designated. Here, when the word line 100 and a column selection line 300 are applied with a high voltage, since the switching transistors $Q_1$, $Q_4$, $Q_5$, and $Q_6$ are turned on, potentials of the storage nodes $N_1$ and $N_2$ are read out, or data is written into the storage nodes $N_1$ and $N_2$ through a common bit line 400. In FIG. 11, although the resistors $R_1$ and $R_2$ are intended to represent load members, these resistors may be replaced by load transistors.

In the above-mentioned SRAM, it is important to design the memory cell so that it operates stably against non-uniformity of pattern shapes of elements and noise margin.

FIG. 12 shows an input/output characteristic of the $Q_1$-$Q_2$ inverter and an input/output characteristic of the $Q_3$-$Q_4$ inverter with respect to potentials of the storage nodes $N_1$ and $N_2$ just after rewriting of the memory cell (at the time when the switching transistors are in a turned-on state). As shown in FIG. 12, an output potential of the $Q_3$-$Q_4$ inverter with respect to an input signal potential $V_1$ which is larger than a potential $V_T$ is represented by $V_2$, and when this potential $V_2$ is inputted to the $Q_1$-$Q_2$ inverter, its output potential is represented by $V_3$. From this, it will be seen that the output potential of the $Q_1$-$Q_2$ inverter approaches a point A. Conversely, when a potential smaller than the potential $V_T$ is inputted to the $Q_3$-$Q_4$ inverter, the output potential of the $Q_1$-$Q_2$ inverter will approach a point D. As shown here, the potential $V_T$ is a boundary of logics "0" and "1" for the output of the storage node $N_1$, and represents a threshold value voltage. In this respect, points A to D represent the following states.

Point A: writing when the storage node $N_1$ is logic "1".

Point B: reading out when the storage node $N_1$ is logic "1".

Point C: reading out when the storage node $N_1$ is logic "0".

Point D: writing when the storage node $N_1$ is logic "0".

It has been known that the memory cell can be operated more stably when the area of a hatched portion formed by the input/output characteristic curve of the $Q_1$-$Q_2$ inverter and the input/output characteristic curve of the $Q_3$-$Q_4$ inverter becomes larger. In order to increase the area of the hatched portion, it is necessary to increase a $\beta$ ratio of the switching transistors $Q_1$ and $Q_4$ to the driving transistors $Q_2$ and $Q_3$ as far as possible. In this respect, $\beta$ and the $\beta$ ratio is obtained from the following equations.

$$\beta = \mu_N \times C_{ox} \frac{W_{eff}}{L_{eff}} \qquad (1)$$

$$\beta\text{ratio} = \frac{\beta_D}{\beta_S}$$

Where, $\mu_N$ is the carrier mobility, $C_{ox}$ is the gate capacitance, $W_{eff}$ is the effective channel width, $L_{eff}$ is the effective channel length, $\beta_S$ is of the switching transistor, and $\beta_D$ is $\beta$ of the driving transistor.

Normally, it is known that a value of the $\beta$ ratio is suitably about 2.5 to 5. From the equation (1), it is seen that in order to increase the $\beta$ ratio as far as possible, $\beta_D$ may be increased as far as possible as compared with $\beta_S$. In order to increase $\beta_D$, it is required to increase the effective channel width of the driving transistor. As a result, the size of the driving transistor is made necessarily large. Accordingly, it becomes impossible to manufacture the driving transistor with a minimum size, and thus there is a problem in that the high integration of a semiconductor memory device is disturbed.

Furthermore, Japanese Patent Laid-Open Publication No. 62-230058 discloses a non-volatile semiconductor memory device including a SRAM and an EEPROM connected to each other. In this semiconductor memory device, the miniaturization and the high integration of the driving transistor are achieved by reducing a film thickness of a gate insulation film of the SRAM to the same thickness as the tunnel insulation film of EEPROM and reducing a resistance value thereby to reduce the area of the driving transistor. However, this prior art example relates to a semiconductor memory device having both the SRAM and the EEPROM, and it is not related to the SRAMs and logic LSI including SRAMs.

SUMMARY OF THE INVENTION

The present invention is aimed to solve the problems mentioned above, and it is an object of the invention to provide a semiconductor memory device improved in the stability in a writing and reading operation without disturbing the high integration, and irrespective of non-uniformity of pattern shapes of elements and irrespective of noise margin or the like.

In order to achieve the object in the present invention, a semiconductor memory device comprises a memory cell. The memory cell includes a pair of inverters each having a load member and a driving transistor, an output of one inverter being connected to an input of the other inverter, an output of the other inverter being connected to an input of one inverter, and switching transistors respectively connecting storage nodes of the pair of inverters to bit lines, gates of the switching transistors being connected to a word line. The improvement in the semiconductor memory device resides in that a film thickness of an insulating film such as a gate oxide film of each of the switching transistors is thicker than a film thickness of a gate oxide film of each of the driving transistors of the inverters.

It is another object of the invention to provide a semiconductor memory device in which the film thickness of the gate oxide film of each of the driving transistors is equal to a film thickness of a gate oxide film of all transistors having a metal-oxide-semiconductor (hereinafter, referred to as "MOS") structure in a peripheral circuit.

It is still another object of the invention to provide a semiconductor memory device in which the film thickness of the gate oxide film of each of the switching transistors is equal to a film thickness of a gate oxide film of all transistors having the MOS structure in the peripheral circuit.

It is still another object of the invention to provide a semiconductor memory device in which the film thickness of the gate oxide film of each of the switching transistors is equal to a film thickness of a gate oxide film of a part of the transistors having the MOS structure in the peripheral circuit, and the film thickness of the gate oxide film of each of the driving transistors is equal to a film thickness of a gate oxide film of the rest of the transistors having the MOS structure in the peripheral circuit.

It is still another object of the invention to provide a semiconductor memory device in which a relationship between the film thickness of the gate oxide film of the switching transistor and the film thickness of the gate oxide film of the driving transistor is such that the film thickness of the gate oxide film of the driving transistor:the film thickness of the gate oxide film of the switching transistor = 10:11 to 10:20.

It is still another object of the invention to provide a semiconductor memory device in which a relationship between the film thickness of the gate oxide film of the switching transistor and the film thickness of the gate oxide film of the driving transistor is such that, preferably the film thickness of the gate oxide film of the driving transistor:the film thickness of the gate oxide film of the switching transistor = 10:12 to 10:15.

It is still another object of the invention to provide a semiconductor memory device comprising a memory cell including a pair of inverters each having a load member and a driving transistor, an output of one inverter being connected to an input of the other inverter, an output of the other inverter being connected to an input of one inverter, and switching transistors respectively connecting storage nodes of the pair of inverters to bit lines, gates of the switching transistors being connected to a word line. The improvement in semiconductor memory device resides in that a dielectric constant of a gate oxide film of each of the driving transistors is larger than a dielectric constant of a gate oxide film of each of the switching transistors of the inverters.

In one aspect of the present invention, from the above-mentioned equation (1), in order to make the $\beta$ ratio larger as far as possible, it is required to make $\beta_S$ ($\beta$ of the switching transistor) smaller than $\beta_D$ ($\beta$ of the driving transistor). To attain this, there is a method of extending the gate length of the switching transistor (which serves also as a word line), or reducing the gate capacitance $C_{ox}$.

When the gate length is extended, a memory area is increased by an amount corresponding to a widened word line width. On the other hand, in the method of reducing the gate capacitance $C_{ox}$, it is possible to reduce $\beta_S$ without increasing the gate length. In addition, since the word line capacitance can also be reduced, it is effective and suitable in a high speed operation.

In this respect, the gate capacitance Cox is expressed by the following equation (2).

$$C_{ox} = \frac{\epsilon_{ox}\epsilon_o}{T_{ox}} \quad (2)$$

where, $T_{ox}$ is the oxide film thickness, $\epsilon_{ox}$ is the relative permittivity of the oxide film, and $\epsilon_o$ is the permittivity $(8.9 \times 10^{-12}$ F/m) in a free space.

From the equation (2), it will be seen that when $T_{ox}$ is reduced, that is, when the film thickness of the gate oxide film of the driving transistor is reduced, the gate capacitance $C_{ox}$ will be increased.

Accordingly, when the film thickness of the gate oxide film of the switching transistor is made thicker than the film thickness of the gate oxide film of the driving transistor, it is possible to increase the $\beta$ ratio.

In another aspect of the present invention, since the film thickness of the gate oxide film of the driving transistor is made equal to the film thickness of the gate oxide film of all the MOS transistors in the peripheral circuit, it is possible, in addition to the above-mentioned technical effect, to increase the driving capability of the MOS transistors in the peripheral circuit. Accordingly, the high speed operation of the overall SRAM device can be attained.

In still another aspect of the present invention, since the film thickness of the gate oxide film of the switching transistor is made equal to the film thickness of the gate oxide film of all the MOS transistors in the peripheral circuit, it is possible, as a result of this, to reduce the thickness of only the gate oxide film of the driving transistors of the SRAM. Accordingly, it is possible to increase the $\beta$ ratio of the memory cell without reducing the hot carrier resistive property of the peripheral circuit. Therefore, it is possible to obtain the SRAM which is improved in the reliability and stability.

In still another aspect of the present invention, since the film thickness of the gate oxide film of each of the switching transistors is equal to a film thickness of a gate oxide film of a part of the transistors having the MOS structure in the peripheral circuit, and the film thickness of the gate oxide film of each of the driving transistors is equal to a film thickness of a gate oxide film of the rest of the transistors having the MOS structure in the peripheral circuit, it is possible to obtain, in addition to the above-mentioned technical effect, the SRAM which is improved in the reliability and stability. Specifically, the gate oxide film of a circuit (for example, transfer gate, sense amplifier gate, and like) of which hot carrier deterioration appears to be relatively large in the peripheral circuit is made thick, and the gate oxide film of the other portion is made thin, thereby to obtain the SRAM which is improved in the reliability and the stability.

In still another aspect of the present invention, since it is arranged such that the film thickness of the gate oxide film of the driving transistor:the film thickness of the gate oxide film of the switching transistor = 10:11 to 10:20, it is possible to obtain the SRAM which is improved in the reliability and the stability.

In still another aspect of the present invention, since it is arranged such that the film thickness of the gate oxide film of the driving transistor:the film thickness of the gate oxide film of the switching transistor = 10:12 to 10:15, it is possible to obtain the SRAM which is improved in the reliability and the stability.

In still another aspect of the present invention, since the dielectric constant of a gate oxide film of each of the driving transistors is larger than the dielectric constant of a gate oxide film of each of the switching transistors of the inverters, in accordance with the equations (1) and (2), it is possible to increase the gate capacitance $C_{ox}$, and thereby to increase the $\beta$ ratio.

BRIEF DESCRIPTION OF THE DRAWINGS

FIG. 9 is a partial sectional view of a semiconductor memory device illustrating a manufacturing process thereof in the embodiment of the present invention.

FIG. 10 is a partial sectional view of a semiconductor memory device illustrating a manufacturing process thereof in the embodiment of the present invention.

DESCRIPTION OF THE PREFERRED EMBODIMENTS

Embodiments of the present invention will be described with reference to the drawings.

FIGS. 1 to 10 are partial sectional views illustrating manufacturing processes of a semiconductor memory device of the present invention. The semiconductor memory device includes on the same substrate, driver MOS transistors (corresponding to driving transistors) and transfer MOS transistors (corresponding to switching transistors) and MOS transistors in the peripheral circuit. In this respect, FIGS. 1 to 10 show a memory cell and a part of a peripheral circuit of the semiconductor memory device.

Figure 1:
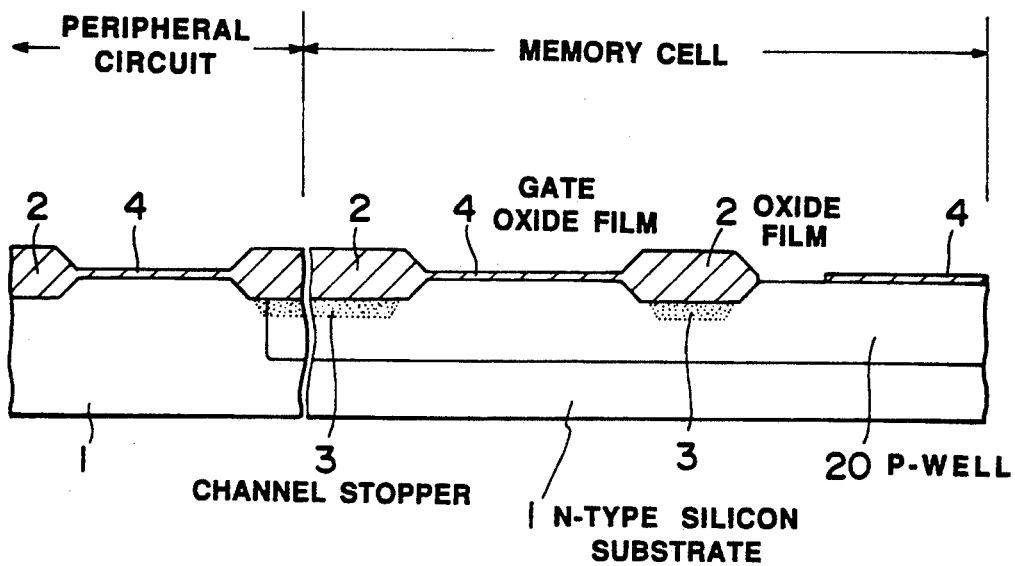
FIG. 1 is a partial sectional view of a semiconductor memory device illustrating a manufacturing process thereof in an embodiment of the present invention.

In a process shown in FIG. 1, after forming a P well 20 and an N well (not show) in an N-type silicon substrate 1 by a well-known technique, a thin oxide film is formed on the N-type silicon substrate 1, and a nitride film is further formed on the thin oxide film. Thereafter, the nitride film in an active region (to-be-formed transistor region) is selectively left, and the nitride film of the other portion is removed. Subsequently, channel stopper ions are ion implanted selectively in a non-active region of the N-type silicon substrate 1 to form a channel stopper 3. Then, an oxide film 2 having a thickness of 600 nm is formed in the non-active region by thermal oxidation thereby to separate elements from each other. Subsequently, the oxide film in the active region is removed, a gate oxide film 4 having a thickness of 15 nm is formed anew in the active region, and boron (B) for adjusting a threshold value is ion implanted in a channel region. Thereafter, a part (a portion in which the gate of the driver MOS transistor 5 contacts with the substrate 1 in a later process) of the gate oxide film 4 in a transfer MOS transistor region is selectively removed, and the N-type silicon substrate 1 in this part is exposed.

Figure 2:
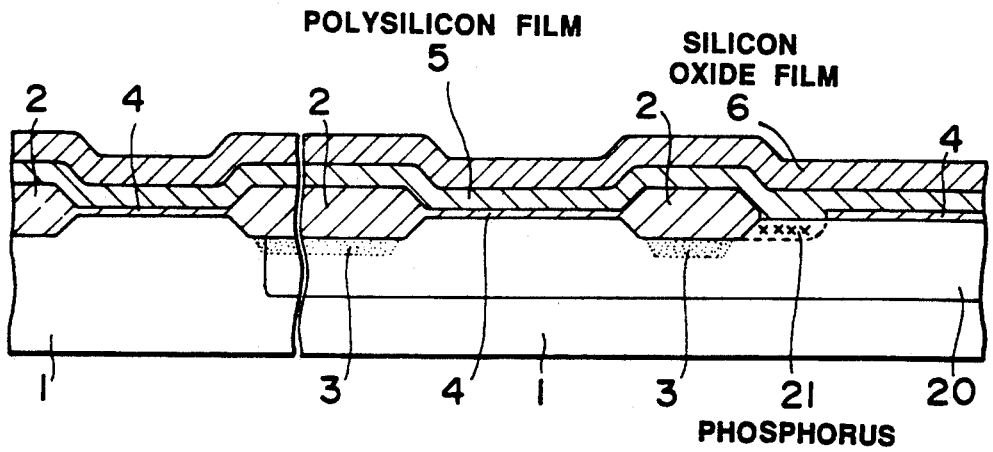
FIG. 2 is a partial sectional view of a semiconductor memory device illustrating a manufacturing process thereof in the embodiment of the present invention.

Subsequently, in a process shown in FIG. 2, a polysilicon film 5 having a thickness of 200 nm is formed by a CVD (chemical vapor deposition) technique in an atmosphere of 620° C. over the whole surface of the N-type silicon substrate 1 obtained in the process shown in FIG. 1, and then, phosphorous (P) is doped in the polysilicon film 5 by using $POCL_3$, thereby to decrease a resistance of the polysilicon film 5. At this time, in the portion from which the gate oxide film 4 is removed in the process shown in FIG. phosphorous 21 is diffused. Next, a silicon oxide film 6 of 250 nm in thickness is formed over the whole surface of the N-type silicon substrate 1 by the CVD technique in an atmosphere of 430° C.

Figure 3:
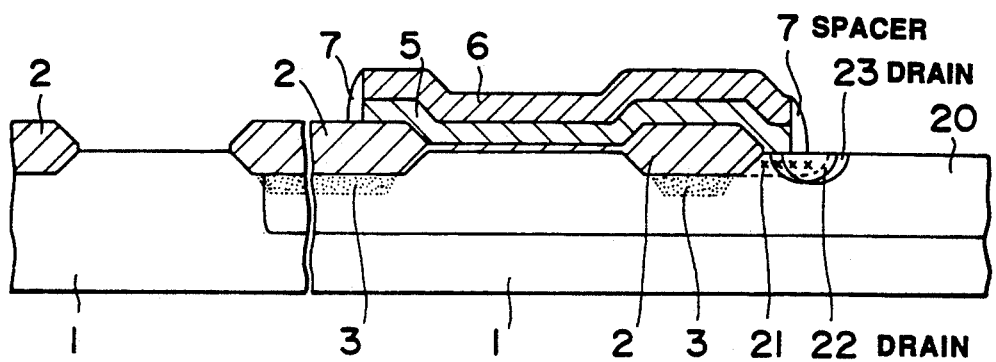
FIG. 3 is a partial sectional view of a semiconductor memory device illustrating a manufacturing process thereof in the embodiment of the present invention.

In a process shown in FIG. 3, the silicon oxide film 6 is selectively removed by anisotropy dry etching excepting a portion which is to be a gate region of a driver MOS transistor, and the remaining portion of the silicon oxide film 6 is used as a mask to remove the polysilicon film 5 and the gate oxide film 4 by dry etching. In the process, the gate oxide film (thickness of 15 nm) of the driver MOS transistor has been formed. Thereafter, a silicon oxide film 200 nm in thickness is formed over the whole surface of the N-type silicon substrate 1 by the CVD technique in an atmosphere of 430° C., and this film is etched back to form a spacer 7 on a side surface of a gate of the driver MOS transistor thereby to complete the gate of the driver MOS transistor.

Figure 4:
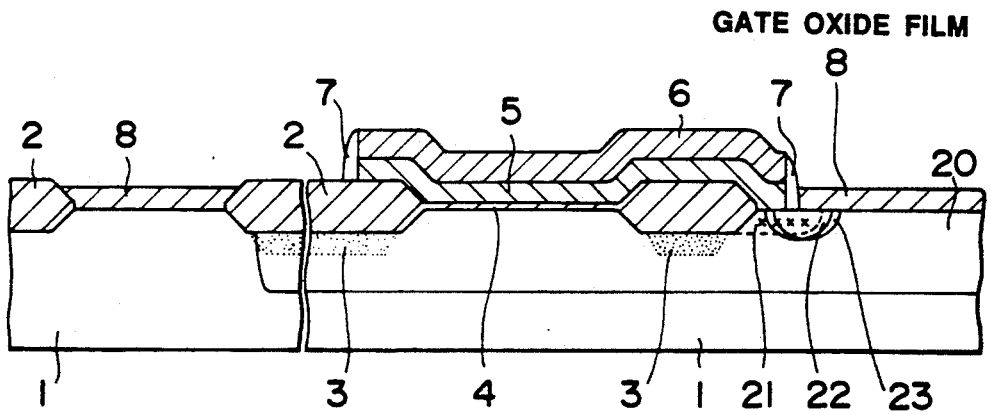
FIG. 4 is a partial sectional view of a semiconductor memory device illustrating a manufacturing process thereof in the embodiment of the present invention.

In a process shown in FIG. 4, phosphorous having a relatively high concentration is ion implanted selectively in the to-be-formed drain 22, 23 regions in the N-type silicon substrate 1 obtained in the process shown in FIG. 3, and subsequently, arsenic having a high concentration is ion implanted to form the drains 22, 23. Thereafter, a gate oxide film 8 having a thickness of 18 nm is formed on the exposed portion of the N-type silicon substrate 1. In this process, the gate oxide film 8 (18 nm in thickness) of the transfer MOS transistor has been formed. In this respect, the film thickness of the gate oxide film 8 is made thicker than the film thickness of the gate oxide film 4 of the drive MOS transistor which is formed in the previous process.

Figure 5:
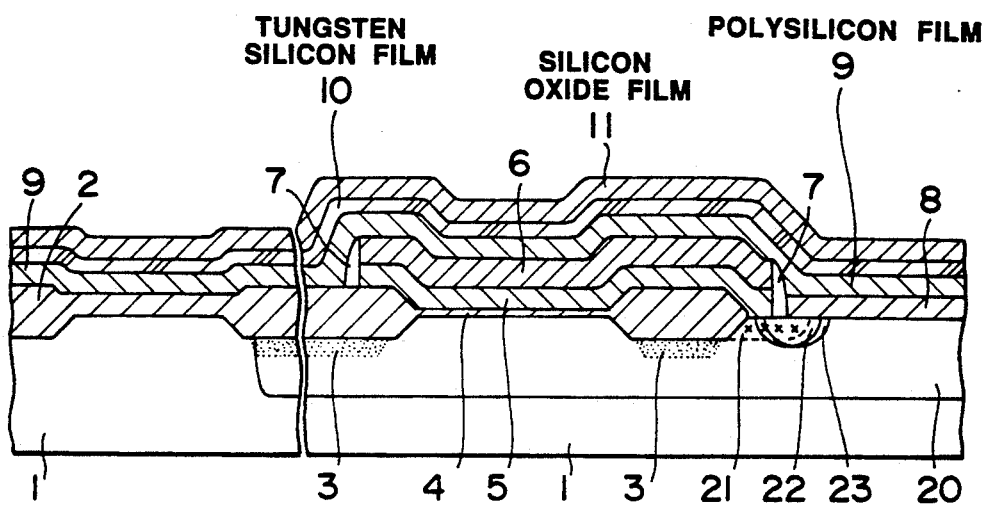
FIG. 5 is a partial sectional view of a semiconductor memory device illustrating a manufacturing process thereof in the embodiment of the present invention.

In a process shown in FIG. 5, a polysilicon film 9 having a thickness of 100 nm is formed by the CVD technique in an atmosphere of 620° C. over the whole surface of the N-type silicon substrate 1, and subsequently, phosphorous is doped in the polysilicon film 9 by using POCL$_3$, thereby to decrease the resistance of the polysilicon film 9. Next, after forming a tungsten silicide film 10 having a thickness of 120 nm by the CVD technique, a silicon film 11 having a thickness of 100 nm is formed by the CVD technique in an atmosphere of 430° C.

Figure 6:
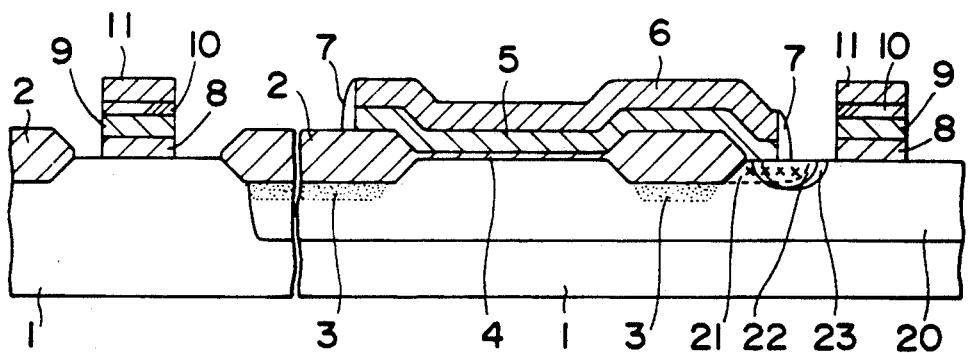
FIG. 6 is a partial sectional view of a semiconductor memory device illustrating a manufacturing process thereof in the embodiment of the present invention.

In a process shown in FIG. 6, the silicon film 11 is selectively removed by the anisotropical dry etching with the exception of the to-be-formed gate region of the transfer MOS transistor and the to-be-formed gate region of the peripheral circuit, and the remaining silicon film 11 is used as a mask to remove the tungsten silicide film 10, polysilicon film 9 and the gate oxide film 8 by dry etching. At this time, the gate of the driver MOS transistor is protected by the silicon oxide film 6.

Figure 7:
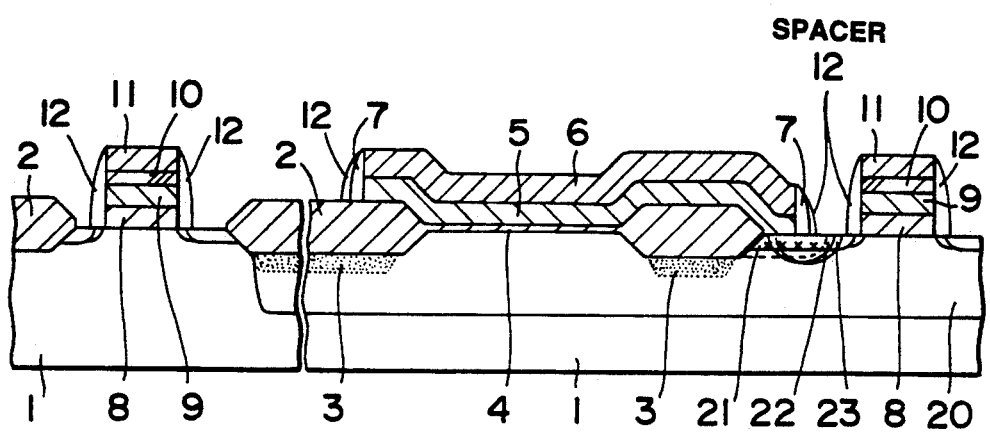
FIG. 7 is a partial sectional view of a semiconductor memory device illustrating a manufacturing process thereof in the embodiment of the present invention.

In a process shown in FIG. 7, phosphorous having a relatively low concentration is ion implanted in the whole surface of the N-type silicon substrate 1 obtained in the process shown in FIG. 6. At this time, each gate formed in the previous process serves as a mask. Thereafter, a silicon oxide film 300 nm in thickness is formed by the CVD technique in an atmosphere of 430° C. over the whole surface of the N-type silicon substrate 1, and spacers 12 are formed on side surfaces of all the gates by etching back. Thereafter, an oxide film having a thickness of 5 nm is formed on exposed portions of the N-type silicon substrate 1 by thermal oxidation, and then arsenic is ion implanted in this portions to form a source and a drain.

Figure 8:
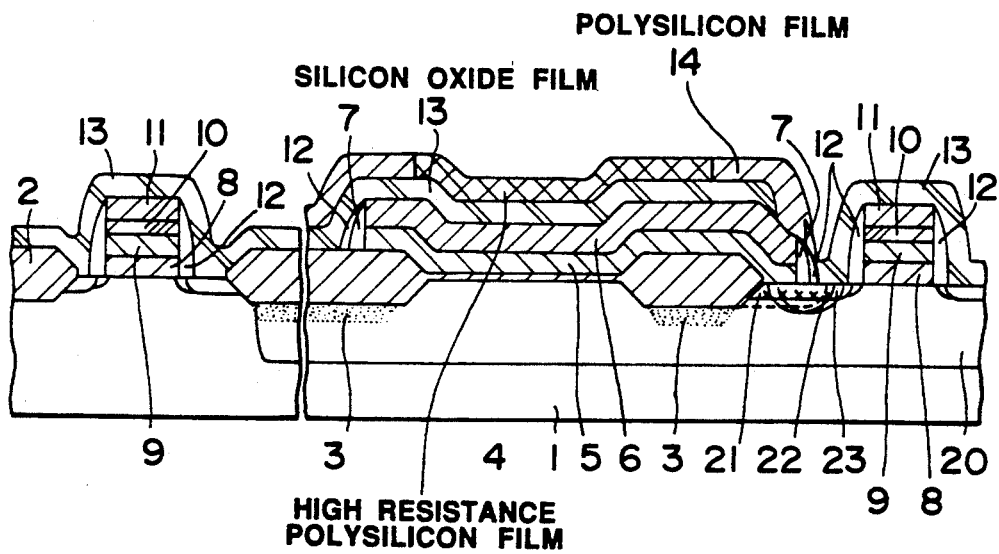
FIG. 8 is a partial sectional view of a semiconductor memory device illustrating a manufacturing process thereof in the embodiment of the present invention.
Figure 11:
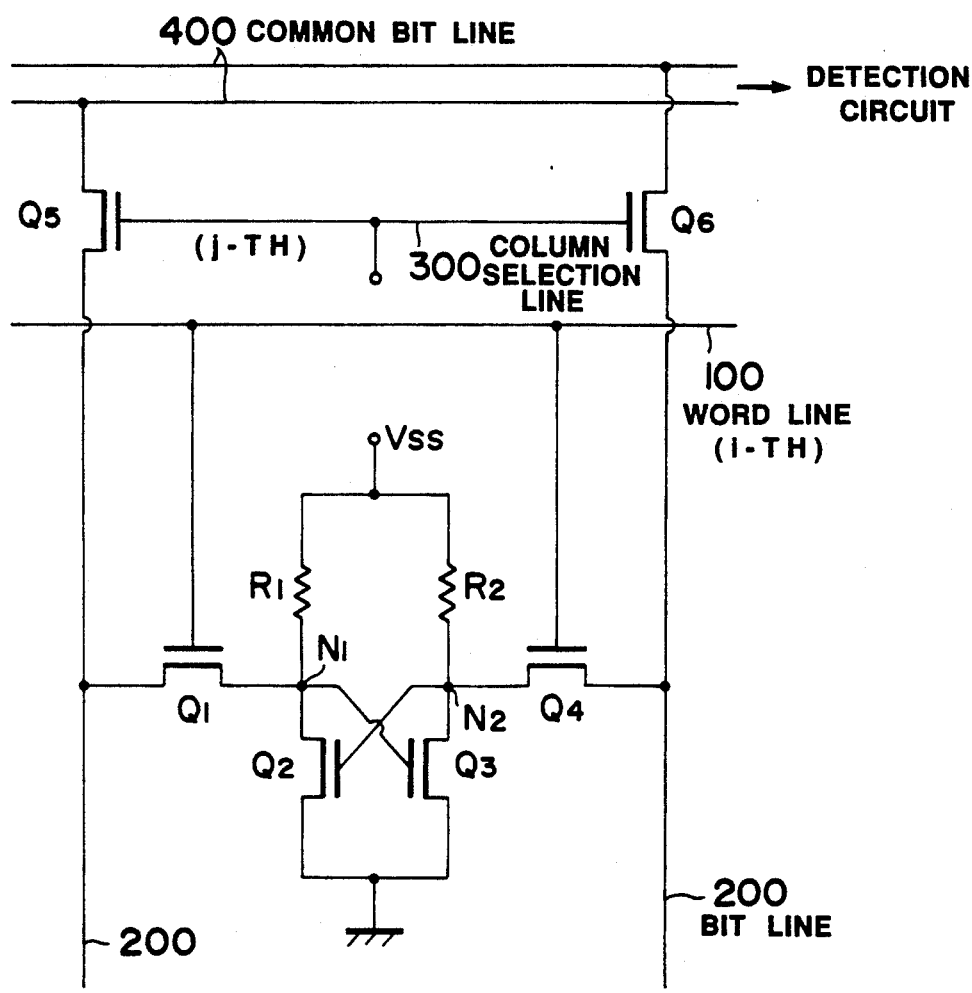
FIG. 11 shows a circuit diagram of an SRAM.
Figure 12:
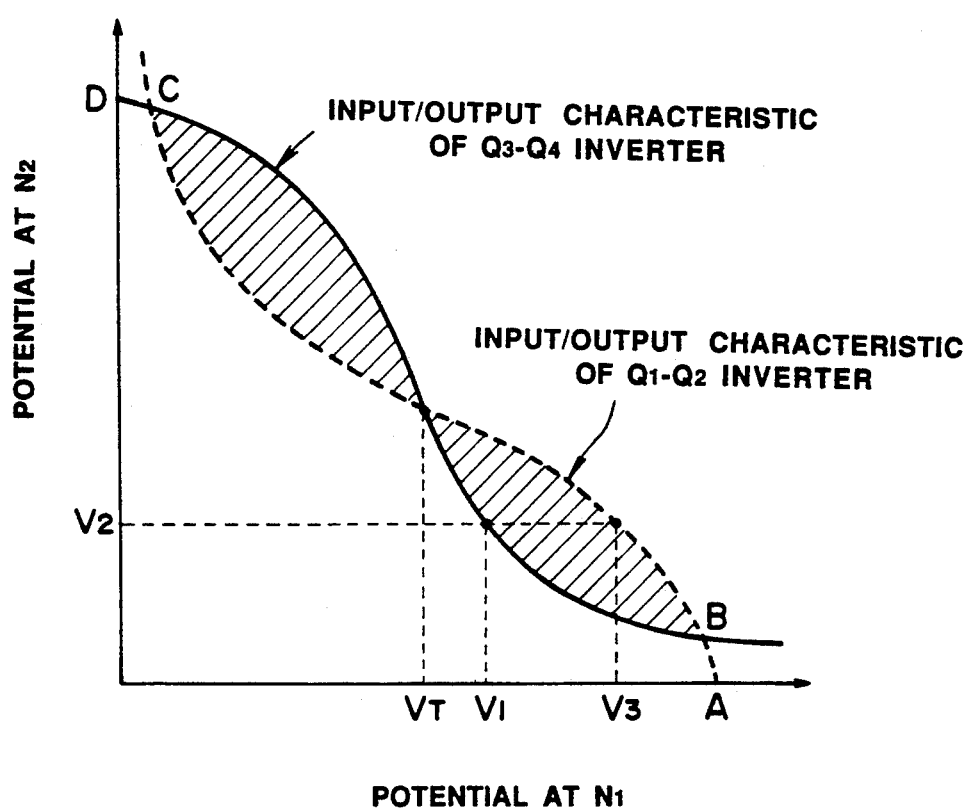
FIG. 12 is a diagram showing an input/output characteristic of a $Q_1$–$Q_2$ inverter and an input/output characteristic of a $Q_3$–$Q_4$ inverter with respect to potentials of storage nodes $N_1$ and $N_2$ just after rewriting of the circuit shown in FIG. 11.

In a process shown in FIG. 8, after forming a silicon oxide film 13 having a thickness of 100 nm by the CVD technique in an atmosphere of 430° C. over the whole surface of the N-type silicon substrate 1 obtained in the process shown in FIG. 7, the silicon oxide film 13 is selectively etched to open a contact hole to the driver MOS transistor. Next, a polysilicon film 14 having a thickness of 100 nm is formed by the CVD technique in an atmosphere of 580° C. over the whole surface of the N-type silicon substrate 1. Thereafter, a wiring and high resistor pattern is formed selectively on the polysilicon film 14, and the polysilicon film 14 is removed leaving the wiring and high resistor portion. Then, arsenic is ion implanted selectively into the polysilicon film 14 of the wiring portion.

In a process shown in FIG. 9, after forming a silicon oxide film 15 having a thickness of 100 nm by the CVD technique in an atmosphere of 430° C. over the whole surface of the N-type silicon substrate obtained in the process shown in FIG. 8, a BPSG (boron-phoso-silicate glass) film 300 nm in thickness is formed by the CVD technique in an atmosphere of 430° C.

In a process shown in FIG. 10, after smoothing by a heat treatment the surface of the N-type silicon substrate 1 obtained in the process shown in FIG. 9, a contact hole for connecting a metal wiring 17 which is formed later the the N-type silicon substrate 1, and a contact hole for connecting the metal wiring 17 to the gate are opened. Subsequently, a metal wiring layer of an aluminum alloy is formed by sputtering over the whole surface of the N-type silicon substrate 1, and the desired metal wiring 17 is formed by patterning the metal wiring layer. Thereafter, an oxide film 18 is deposited by a plasma CVD technique, and a resist is coated on the oxide film 18. Then, the oxide film 18 is smoothed by etching back with a gas ratio having the same etching rate as the resist and the oxide film 18.

Thereafter, if desired, a contact hole is opened, and other wirings are formed, thereby to form a multilayer wiring, and to complete the semiconductor memory device.

In this manner, the semiconductor memory device having a structure in which the film thickness of the gate oxide film 8 of the transfer MOS transistor is thicker than the film thickness of the gate oxide film 4 of the driver MOS transistor is obtained.

In this embodiment, although the thickness of the gate oxide film 4 of the driver MOS transistor is made 15 nm, and the thickness of the gate oxide film 8 of the transfer MOS transistor is made 18 nm, the present invention is not limited to this, and it is preferable to satisfy the following relationship in which the thickness of the gate oxide film 4 of the driver MOS transistor:the thickness of the gate oxide film 8 of the transfer MOS transistor = 10:11 to 10:20, or preferably 10:12 to 10:15.

Furthermore, in the embodiment, although the thickness of the gate oxide film 4 of the driver MOS transistor is made thinner than the thickness of other gate oxide films, the present invention is not limited to this, and only the thickness of the gate oxide film 8 of the transfer MOS transistor may be made thicker than other gate oxide films. And by doing so, it is possible to increase the driving capability of the MOS transistors in the peripheral circuit, and to achieve high speed operation of the overall semiconductor memory device.

Furthermore, the thickness of the gate oxide film of the transfer MOS transistor may be made equal to the thickness of the gate oxide film of a part of the MOS transistors in the peripheral circuit, and the thickness of the gate oxide film of the driver MOS transistor may be made equal to the thickness of the gate oxide film of the rest of the driver MOS transistors in the peripheral circuit. And by doing so, in the peripheral circuit, the gate oxide film of a circuit (for example, transfer gate, sense amplifier gate, and the like) of which hot carrier deterioration appears to be large is made thick and the gate oxide film of the other part is made thin, thereby to provide the semiconductor memory device in which the reliability and the stability are improved.

Next, another embodiment of the present invention will be described.

Figure 13:
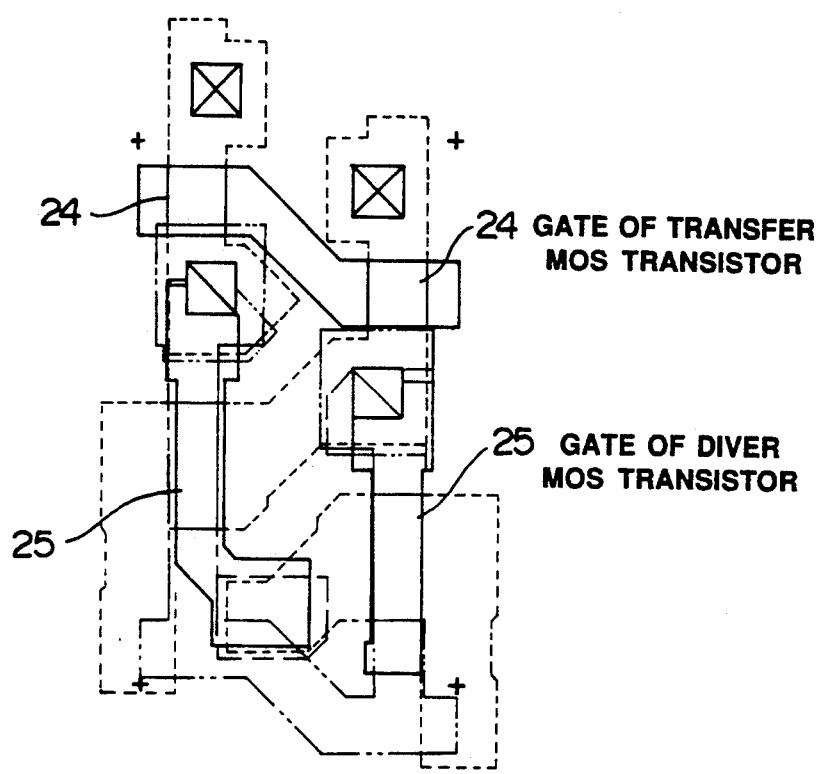
FIG. 13 is a layout diagram of a SRAM in another embodiment of the present invention.

FIG. 13 is a layout diagram of a semiconductor memory device (SRAM) processes by processes similar to that described in the foregoing. In FIG. 13, black portions represent gates of transfer MOS transistors and gates of driver MOS transistors.

The cell size of a SRAM which uses 0.5 μm design rule is $5.45 \times 3.5 = 19.075$ (μm²), the $\beta$ ratio=2.5. Furthermore, in a driver MOS transistor of this SRAM, a gate width ($W_{eff}$)=1.25 μm.

In this SRAM, only the film thickness of the gate oxide film of the transfer MOS transistor is made 15 nm, and the film thickness of the gate oxide film of the transfer MOS transistor is formed thicker than the film thickness of the gate oxide film of 11 nm of the driver MOS transistor. When this condition is introduced into the equations (1) and (2), the following numerical values are obtained in which in the transfer MOS transistor, the gate width ($W_{eff}$)=0.917 μm, the cell size=$5.15 \times 3.5 = 18.025$ (μm²), and the cell size can be reduced by about 5%. From this, by making the film thickness of the gate oxide film of the transfer MOS transistor thicker than the film thickness of the gate oxide film of the driver MOS transistor, it is confirmed that the miniaturization and the high integration of the driver MOS transistor can be achieved.

Furthermore, as regards the hot carrier characteristics, in the SRAM, the transfer MOS transistor is weaker than the driver MOS transistor. Accordingly, by making the film thickness of the gate oxide film of the transfer MOS transistor thicker than the film thickness of the gate oxide film of the driver MOS transistor, it is possible to relatively improve the hot carrier resistive property.

In the embodiment, the $\beta$ ratio is increased in view of the relationship between the film thickness of the gate oxide film of the transfer MOS transistor and the film thickness of the gate oxide film of the driver MOS transistor. However, the present invention is not limited to this, and the $\beta$ ratio may be increased, for example, by forming the gate oxide film of the driver MOS transistor with an oxide film having a high dielectric constant such as tantalum oxide or the like so that the dielectric constant of the gate oxide film of the driver MOS transistor is made larger than the dielectric constant of the gate oxide film of the transfer MOS transistor, thereby to increase the gate capacitance $C_{ox}$ of the driver MOS transistor.

Furthermore, in the embodiment, although an example of the manufacturing processes of the semiconductor memory device is described, the manufacturing method is not limited to this, and other manufacturing methods may be employed as far as it is possible to obtain a semiconductor memory device having a structure in which a film thickness of the gate oxide film of the switching transistor (transfer MOS transistor) is thicker than a film thickness of the gate oxide film of the driving transistor (driver MOS transistor).

It is apparent that the present invention is applicable to various types of SRAMs including an E/D type (a combination of a transistor (E type) applied with an input voltage and a transistor (D type) connected in series), a high resistance load type, a CMOS (complementary MOS), etc., to obtain similar technical effects.

As described in the foregoing, in the present invention, the following advantages are provided.

In one aspect of the invention, since the film thickness of the gate oxide film of the switching transistor is made thicker than the film thickness of the gate oxide film of the driving transistor of the memory cell, the gate capacitance of the switching transistor can be made smaller than the gate capacitance of the driving transistor. Accordingly, since $\beta$ of the driving transistor can be made larger than $\beta$ of the switching transistor without increasing the size of the semiconductor memory device, it is possible to increase the $\beta$ ratio. As a result, the stability of a writing and reading operation of the semiconductor memory device is improved without disturbing the high integration, and irrespective of the non-uniformity of the pattern shapes of elements, and noise margin, or the like.

In another aspect of the invention, since the film thickness of the gate oxide film of the driving transistor is made equal to the film thickness of the gate oxide film of all the MOS transistors in the peripheral circuit, in addition to the above-mentioned advantage, the driving capability of the MOS transistor in the peripheral circuit can be increased. As a result, it is possible to achieve high speed operation of the overall semiconductor memory device.

In still another aspect of the invention, since the film thickness of the gate oxide film of the switching transistor is made equal to the film thickness of the gate oxide film of all the MOS transistors in the peripheral circuit, the $\beta$ ratio of the memory cell can be increased without degrading the hot carrier resistive property of the peripheral circuit. As a result, in addition to the above-mentioned advantage, the reliability and the stability of the semiconductor memory device can be improved.

In still another aspect of the invention, since the film thickness of the gate oxide film of the switching transistor is made equal to the film thickness of the gate oxide film of a part of the MOS transistors in the peripheral circuit, and the film thickness of the gate oxide film of the driving transistor is made equal to the film thickness of the gate oxide film of the rest of the MOS transistors in the peripheral circuit, in addition to the above-mentioned advantage, the reliability and the stability of the semiconductor memory device can be improved.

In still another aspect of the invention, since the following relationship between the film thicknesses is adopted such that the film thickness of the gate oxide film of the driving transistor:the film thickness of the gate oxide film of the switching transistor=10:11 to 10:20, in addition to the above-mentioned advantage, the reliability and the stability of the semiconductor memory device can be improved.

In still another aspect of the invention, since the following relationship between the film thicknesses is adopted such that the film thickness of the gate oxide film of the driving transistor:the film thickness of the gate oxide film of the switching transistor=10:12 to 10:15, in addition to the above-mentioned advantage, the reliability and the stability of the semiconductor memory device can be improved.

In still another aspect of the invention, since the dielectric constant of the gate oxide film of the driving transistor is made larger than the dielectric constant of the gate oxide film of the switching transistor, the gate capacitance $C_{ox}$ of the driving transistor can be increased, and thus the $\beta$ ratio can be increased.

What is claimed is:

1. A semiconductor memory device comprising:

a memory cell including a first inverter and a second inverter, each of said inverters having a load member and a driving transistor connected in series, an output of the first inverter being connected to an input of the second inverter and an output of the second inverter being connected to an input of the first inverter, and storage nodes respectively constituted by junction points in each of said inverters; and switching transistors each connected between corresponding one of the storage nodes and a bit line, said each switching transistor having a gate connected to a word line;

the improvement comprising:

a film thickness of a gate oxide film of each switching transistor is thicker than a film thickness of a gate oxide film of said driving transistor in each of said inverters, said film thickness of the gate oxide film of each switching transistor being equal to a film thickness of a gate oxide film of a peripheral metal-oxide semiconductor device subject to hot carrier deterioration.

2. The semiconductor memory device according to claim 1, wherein the film thickness of the gate oxide film of said driving transistor is equal to a film thickness of a gate oxide film of a peripheral metal-oxide semiconductor structure unaffected by hot carrier deterioration.

3. The semiconductor memory device according to claim 1, wherein the film thickness of a gate oxide film of said driving transistor relative to the film thickness of the gate oxide film of said switching transistor has a ratio between 10:11 and 10:20.

4. The semiconductor memory device according to claim 1, wherein the film thickness of a gate oxide film of said driving transistor relative to the film thickness of the gate oxide film of said switching transistor has a ratio between 10:12 and 10:15.

5. In a semiconductor memory device comprising:

a memory cell including a pair of inverters, each of said inverters having a load member and a driving transistor connected in series, an output of the first inverter being connected to an input of the second inverter and an output of the second inverter being connected to an input of the first inverter, and storage nodes respectively constituted by junction points in said pair of inverters; and switching transistors each connected between corresponding one of the storage nodes and a bit line, said each switching transistor having a gate connected to a word line;

the improvement comprising;

a dielectric constant of a gate oxide film of said driving transistor is larger than a dielectric constant of a gate oxide film of said switching transistor.

6. The semiconductor memory device of claim 5, wherein a film thickness of a gate oxide film of said switching transistors is thicker than a film thickness of a gate oxide film of corresponding said driving transistor in each of said inverters.

7. The semiconductor memory device of claim 6, wherein the film thickness of a gate oxide film of said driving transistor relative to the film thickness of the gate oxide film of said switching transistor is a ratio between 10:11 and 10:20.

* * * * *